(12) United States Patent
Kwak et al.

(10) Patent No.: US 10,991,788 B2
(45) Date of Patent: Apr. 27, 2021

(54) ORGANIC LIGHT EMITTING DISPLAY APPARATUS

(71) Applicant: Samsung Display Co., Ltd., Yongin-Si (KR)

(72) Inventors: WonKyu Kwak, Seongnam-si (KR); SangMoo Choi, Yongin-si (KR); Dongsun Lee, Hwaseong-si (KR); ChulKyu Kang, Suwon-si (KR); Seungji Cha, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/527,608

(22) Filed: Jul. 31, 2019

(65) Prior Publication Data

US 2020/0044009 A1 Feb. 6, 2020

(30) Foreign Application Priority Data

Aug. 6, 2018 (KR) .................. 10-2018-0091513

(51) Int. Cl.
*H01L 47/00* (2006.01)
*H01L 27/32* (2006.01)
*G09G 3/3275* (2016.01)

(52) U.S. Cl.
CPC ...... *H01L 27/3276* (2013.01); *H01L 27/3265* (2013.01); *G09G 3/3275* (2013.01)

(58) Field of Classification Search
CPC ............ H01L 27/3276; H01L 27/3262; H01L 27/3265; H01L 27/3248
USPC ........................................................... 257/4
See application file for complete search history.

(56) References Cited

U.S. PATENT DOCUMENTS 9,224,972 B2 * 12/2015 Shin ...................... H05B 45/00
9,792,853 B2 * 10/2017 Jeon ..................... G09G 3/3233
2016/0379562 A1 * 12/2016 Yoon ................. H01L 29/42384
345/215
2018/0006105 A1 * 1/2018 Kim ..................... H01L 27/3248
2018/0061324 A1 * 3/2018 Kim ..................... G09G 3/3233

FOREIGN PATENT DOCUMENTS

KR 101469040 B1 12/2014

* cited by examiner

*Primary Examiner* — Luan C Thai
(74) *Attorney, Agent, or Firm* — Cantor Colburn LLP

(57) ABSTRACT

An organic light emitting display apparatus includes active patterns arranged corresponding to a plurality of pixels, and connected to each other along a first direction, a first initialization power supply line to which a first initialization voltage is applied, a second initialization power supply line to which a second initialization voltage different from the first initialization voltage is applied, an organic light emitting diode, and an first transistor which apply the second initialization voltage to a first electrode of the organic light emitting diode.

20 Claims, 10 Drawing Sheets

D1
D2

ORGANIC LIGHT EMITTING DISPLAY APPARATUS

This application claims priority to Korean Patent Application No. 10-2018-0091513, filed on Aug. 6, 2018, and all the benefits accruing therefrom under 35 U.S.C. § 119, the content of which in its entirety is herein incorporated by reference.

BACKGROUND

1. Field

Exemplary embodiments of the invention relate to a display apparatus. More particularly, exemplary embodiments of the invention relate to an organic light emitting display apparatus.

2. Description of the Related Art

An organic light emitting display apparatus displays an image using an OLED ("OLED"). In the OLED, holes provided from an anode and electrons provided from a cathode combine in a light emitting layer between the anode electrode and the cathode electrode to emit light.

The organic light emitting display apparatus includes a plurality of pixels, and in order to improve display quality of the organic light emitting display apparatus, various efforts have been made to improve a structure of the pixel or a layout implementing the pixel.

SUMMARY

One or more exemplary embodiment of the invention provides an organic light emitting display apparatus capable of improving display quality.

According to an exemplary embodiment of the invention, an organic light emitting display apparatus includes active patterns arranged corresponding to a plurality of pixels, and connected to each other along a first direction, a first initialization power supply line to which a first initialization voltage is applied, a second initialization power supply line to which a second initialization voltage different from the first initialization voltage is applied, an organic light emitting diode, and an first transistor which apply the second initialization voltage to a first electrode of the organic light emitting diode.

In an exemplary embodiment, the first transistor may include a first_first transistor and a first_second transistor. A first electrode of the first_first transistor may be electrically connected to a first electrode of the first_second transistor. A second electrode of the first_first transistor may be electrically connected to a second electrode of the first_second transistor. A second initialization signal may be applied to a gate electrode of the first_first transistor and a gate electrode of the first_second transistor.

In an exemplary embodiment, the first_first transistor and the first_second transistor may be disposed adjacent to each other.

In an exemplary embodiment, the active patterns may be physically connected to each other in a pixel of the plurality of pixels. The active patterns may include a channel region of the first_first transistor and a channel region of the first_second organic transistor.

In an exemplary embodiment, the organic light emitting display apparatus may further include an initialization line which extends in the first direction and to which a first initialization signal or a second initialization signal is applied.

In an exemplary embodiment, the first_first transistor and the first_second transistor may overlap the initialization line.

In an exemplary embodiment, the organic light emitting display apparatus may further include a second transistor which is electrically connected to a first power source and the first electrode of the organic light emitting diode, and applies a driving current corresponding to a data signal to the organic light emitting diode, a capacitor electrically connected between a gate electrode of the second transistor and the first power source, and a third transistor which applies the first initialization voltage to the gate electrode of the second transistor and the capacitor in response to a first initialization signal.

In an exemplary embodiment, the organic light emitting display apparatus may further include a data line extending in a second direction intersecting with the first direction and to which the data signal is applied, a fourth transistor electrically connected to a first electrode of the second transistor and the data line, and a fifth transistor electrically connected to the gate electrode of the second transistor and a second electrode of the second transistor.

In an exemplary embodiment, the plurality of pixels may be arranged in a matrix form in the first direction and a second direction intersecting the first direction. The active patterns of the plurality of pixels in the first direction may be connected to each other, and the active patterns of the plurality of pixels in the second direction may include portions which are disconnected to each other.

In an exemplary embodiment, the first transistor may further include a first_first transistor and a first_second transistor. A source electrode of the first_first transistor may be electrically connected to a source electrode of the first__second transistor. A drain electrode of the first_first transistor may be electrically connected to a drain electrode of the first_second transistor. A second initialization signal may be applied to a gate electrode of the first_first transistor and a gate electrode of the first_second transistor. The first_first transistor and the first_second transistor may be arranged adjacent to each other in the first direction.

According to an exemplary embodiment of the invention, an organic light emitting display apparatus includes a substrate, an active layer including active patterns disposed on the substrate, and connected to each other corresponding to at least two pixels, a first gate insulation layer disposed on the substrate on which the active layer is dispose, a first gate layer disposed on the first gate insulation layer, a second gate insulation layer disposed on the first gate insulation layer on which the first gate layer is disposed, a second gate layer disposed on the second gate insulation layer, an interlayer insulation layer disposed on the second gate insulation layer on which the second gate layer is disposed, and a data layer disposed on the interlayer insulation layer.

In an exemplary embodiment, the first gate layer may include an initialization line to which a first initialization signal or a second initialization signal is applied, a scan line to which a scan signal is applied, and an emission control line to which an emission control signal is applied.

In an exemplary embodiment, the second gate layer may include a first initialization power supply line to which a first initialization voltage is applied and a second initialization power supply line to which a second initialization power voltage is applied.

In an exemplary embodiment, the data layer may include a data line to which a data signal is applied, and a first power supply line to which a first power voltage is applied.

In an exemplary embodiment, the organic light emitting display apparatus may further include first_first and first_second transistors, which apply the second initialization voltage to a first electrode of the organic light emitting diode in response to the second initialization signal.

In an exemplary embodiment, the organic light emitting display apparatus may further include a second transistor which is electrically connected to a first power source and the first electrode of the organic light emitting diode, and applies a driving current corresponding to a data signal to the organic light emitting diode, a capacitor electrically connected between a gate electrode of the second transistor and the first power source, and a third transistor which applies the first initialization voltage to the gate electrode of the second transistor and the capacitor in response to a first initialization signal.

In an exemplary embodiment, the data layer may further include a connecting electrode. The connection electrode may be connected to the second initialization power supply line and the first_first and first_second transistors.

In an exemplary embodiment, the first_first transistor and the first_second transistor may overlap the initialization line.

In an exemplary embodiment, a plurality of pixels may be arranged in a matrix form in a first direction and a second direction intersecting the first direction. The active patterns of the plurality of pixels in the first direction may be connected to each other, and the active patterns of the plurality of pixels in the second direction may include portions which are disconnected to each other.

According to an exemplary embodiment of the invention, an organic light emitting display apparatus includes an organic light emitting diode, and first_first and first_second transistors which apply an organic light emitting diode initialization voltage to a first electrode of the organic light emitting diode in response to an organic light emitting diode initialization signal. First and second electrodes of the first_first transistor are electrically connected to first and second electrodes of the first_second transistor, respectively. A gate electrode of the first_first transistor is electrically connected to a gate electrode of the first_second transistor.

According to the exemplary embodiments of the invention, an organic light emitting display apparatus includes active patterns arranged corresponding to a plurality of pixels, and connected to each other along a first direction, a first initialization power supply line to which a first initialization voltage is applied, a second initialization power supply line to which a second initialization voltage different from the first initialization voltage is applied, an OLED, and an OLED initialization transistor which apply the second initialization voltage to an anode electrode of the OLED.

Since the active patterns of the active layer are connected corresponding to the plurality of pixels, static electricity is dispersed even when the static electricity flows in during a manufacturing process, use, or the like, and degree of the characteristic change of the active pattern or the damage of the active pattern is reduced, so that scattering of first to seventh-b transistors which is included in the pixel may be reduced. Accordingly, the display quality of the organic light emitting display apparatus may be improved.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
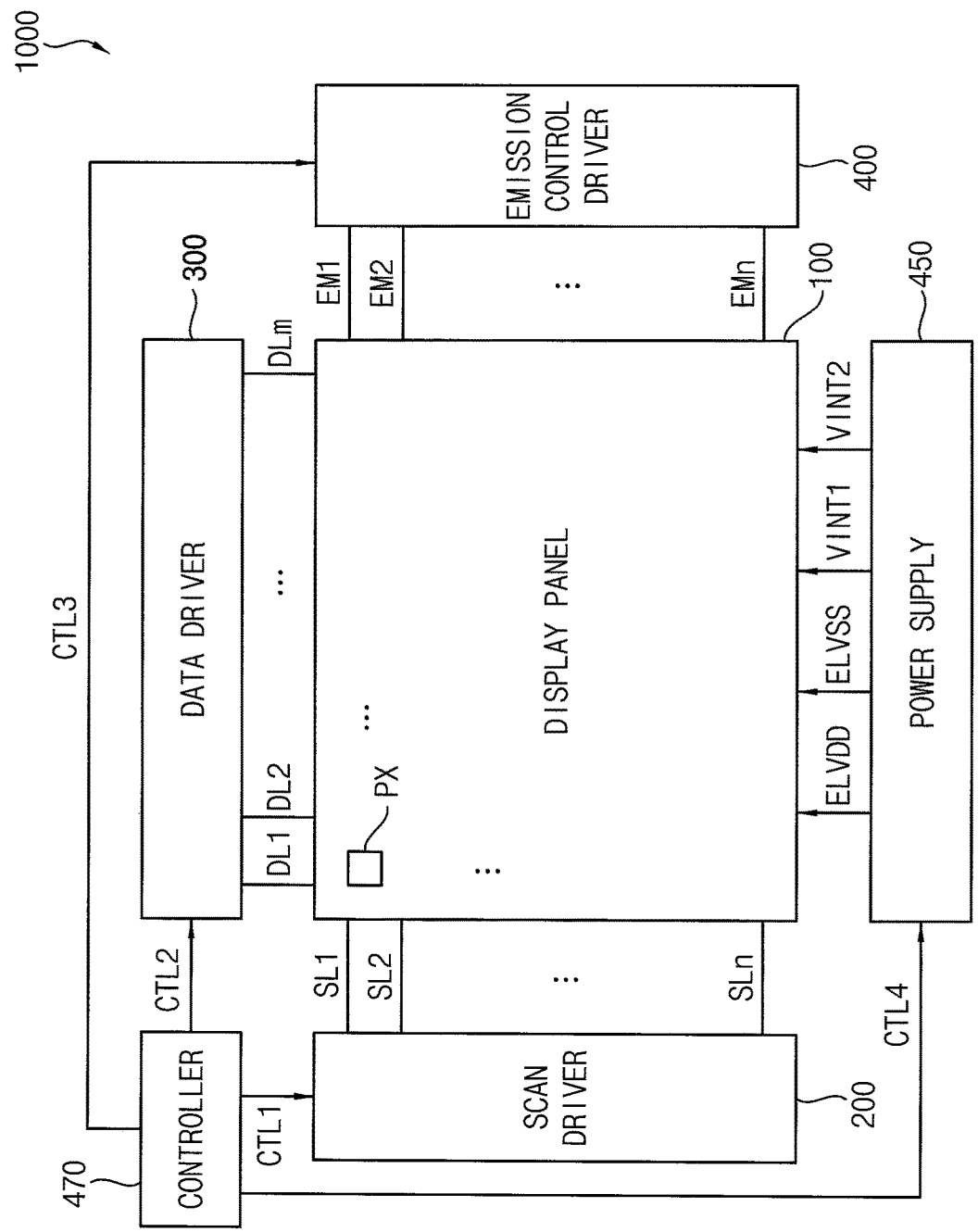
FIG. 1 is a block diagram illustrating an exemplary embodiment of an organic light emitting display apparatus according to the invention.

Hereinafter, the invention will be explained in detail with reference to the accompanying drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a block diagram illustrating an organic light emitting display apparatus according to an exemplary embodiment of the invention.

Referring to FIG. 1, the organic light emitting display apparatus 1000 may include a display panel 100, a scan driver 200, a data driver 300, an emission control driver 400, a power supply 450, and a controller 470.

The display panel 100 may include a pixel PX. In an exemplary embodiment, the display panel 100 may include n*m pixels PX, where n and m are natural numbers, because the pixels PX are arranged at locations corresponding to crossing points of the scan lines SL1 through SLn and the data lines DL1 through DLm, for example.

The scan driver 200 may provide a scan signal to the pixel PX via the scan lines SL1 through SLn based on a first control signal CTL1.

The data driver 300 may provide a data signal to the pixel PX via the data lines DL1 through DLm based on a second control signal CTL2.

The emission control driver 400 may provide an emission control signal to the pixel PX via the emission control lines EM1 through EMn based on a third control signal CTL3.

The power supply 450 may provide power sources such as a first power source ELVDD, a second power source ELVSS, a first initialization power source VINT1, a second initialization power source VINT2, etc. A voltage level of the second power source ELVSS may be lower than a voltage level of the first power source ELVDD. The power supply 450 may provide a first power source ELVDD to a first power terminal of the pixel PX and to selectively provide the first power source ELVDD or the second power source ELVSS to a second power terminal of the pixel PX. Here, the second power terminal of the pixel PX may be connected to a cathode electrode of an OLED. The first initialization power source VINT1 and the second initialization power source VINT2 may have a voltage level between the first power source ELVDD and the second power source ELVSS. The voltage level of the first initialization power source VINT1 may be higher than the voltage level of the second initialization power source VINT2.

The controller 470 may control the scan driver 200, the data driver 300, the emission control driver 400, and the power supply 450. The controller 470 may provide the first control signal CLT1 to the scan driver 200 to control the scan driver 200. The controller 470 may provide the second control signal CLT2 to the data driver 300 to control the data driver 300. The controller 470 may provide the third control signal CLT3 to the emission control driver 400 to control the emission control driver 400. The controller 470 may provide the fourth control signal CTL4 to the power supply 450 to control the power supply 450.

Figure 2:
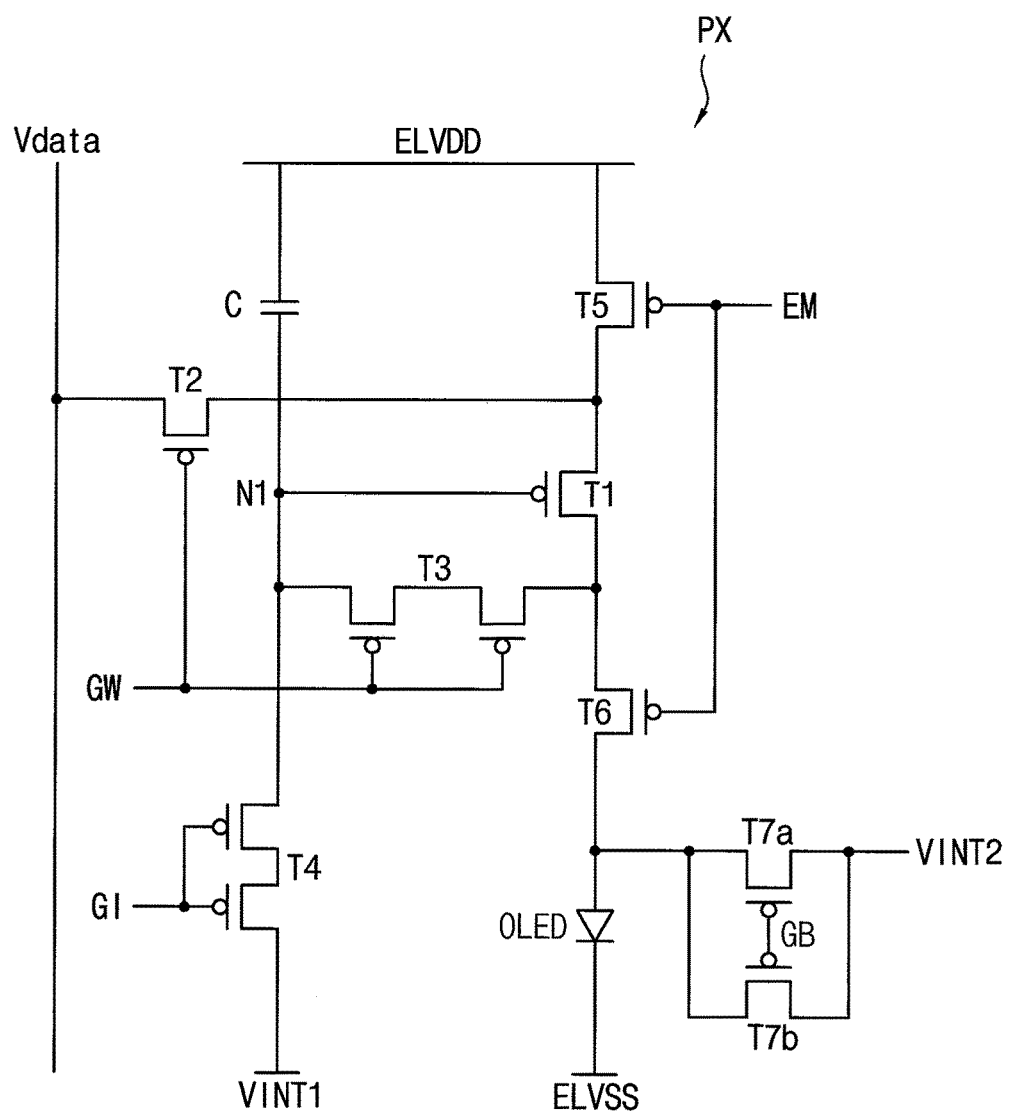
FIG. 2 is a circuit diagram illustrating an example of a pixel included in the organic light emitting display apparatus of FIG. 1.

FIG. 2 is a circuit diagram illustrating an example of a pixel included in the organic light emitting display apparatus of FIG. 1.

Referring to FIG. 2, the pixel PX may include a plurality of transistors T1 through T7a and T7b and a driving capacitor C. In an exemplary embodiment, the first transistor T1 may be connected between the first power source ELVDD and an anode electrode of an organic light emitting diode ("OLED") and may provide a driving current corresponding to the data signal Vdata to the OLED, for example. The second transistor T2 may be connected between the first electrode of the first transistor T1 and the data line. The third transistor T3 may be connected between the gate electrode and the second electrode of the first transistor T1. The fourth transistor T4 may be connected between a first initialization power source VINT1 and the gate electrode of the first transistor T1. The fifth transistor T5 may be connected between the first power source ELVDD and the first electrode of the first transistor T1. The sixth transistor T6 may be connected between the second electrode of the first transistor T1 and the anode electrode of the OLED. The seventh-a transistor T7a and a seventh-b transistor T7b may be connected between a second initialization power source VINT2 and the anode electrode of the OLED. The gate electrode of the first transistor T1 may be connected to a first node N1 which is connected to the driving capacitor C, third transistor T3 and the fourth transistor T4.

Specifically, the fourth transistor T4 may apply a voltage of the first initialization power source VINT1 to the driving capacitor C and the gate electrode of the first transistor T1 in response to a first initialization signal GI to reset the driving capacitor C and the gate electrode of the first transistor T1 as the first initialization power source VINT1. That is, the fourth transistor T4 may be an initialization transistor.

The seventh-a and seventh-b transistors T7a and T7b may be connected to a second initialization signal GB to reset the voltage of the anode electrode of the OLED to the second initialization voltage VINT2. The seventh-a and seventh-b transistors T7a and T7b may apply the second initializing voltage VINT2 to the anode electrode of the OLED in response to the second initialization signal GB. That is, the seventh-a and seventh-b transistors T7a and T7b may be first and second OLED initialization transistors, respectively.

Here, the seventh-a and seventh-b transistors T7a and T7b may be connected in parallel to each other. That is, a gate electrode of the seventh-a transistor T7a and a gate electrode of the seventh-b transistor-a T7b may be connected to each other, a first electrode of the seventh-a transistor T7a and a first electrode of the seventh-b transistor-a T7b may be connected to each other, and a second electrode of the seventh-a transistor T7a and a second electrode of the seventh-b transistor-a T7b may be connected to each other.

The second transistor T2 may apply a data signal Vdata to the first transistor T1 in response to a scan signal GW.

The third transistor T3 may compensate a threshold voltage of the first transistor T1 in response to the scan signal GW by connecting the gate electrode and the drain electrode of the first transistor T1 (i.e., a diode connection of the first transistor T1). Because the second transistor T2 and the third transistor T3 may receive the scan signal GW, the data signal Vdata may be applied while the threshold voltage of the first transistor T1 is compensated.

The first transistor T1 may provide the driving current corresponding to the data signal Vdata to the OLED.

The sixth transistor T6 may be located between the second electrode of the first transistor T1 and the anode electrode of the OLED. The sixth transistor T6 may control light emission of the OLED in response to an emission control signal EM.

Although the exemplary embodiments of FIG. 2 describe that the pixel PX includes the first through seventh transistors T1 through T7b and the driving capacitor C, the pixel may be implemented as a variety of structures.

Figure 3:
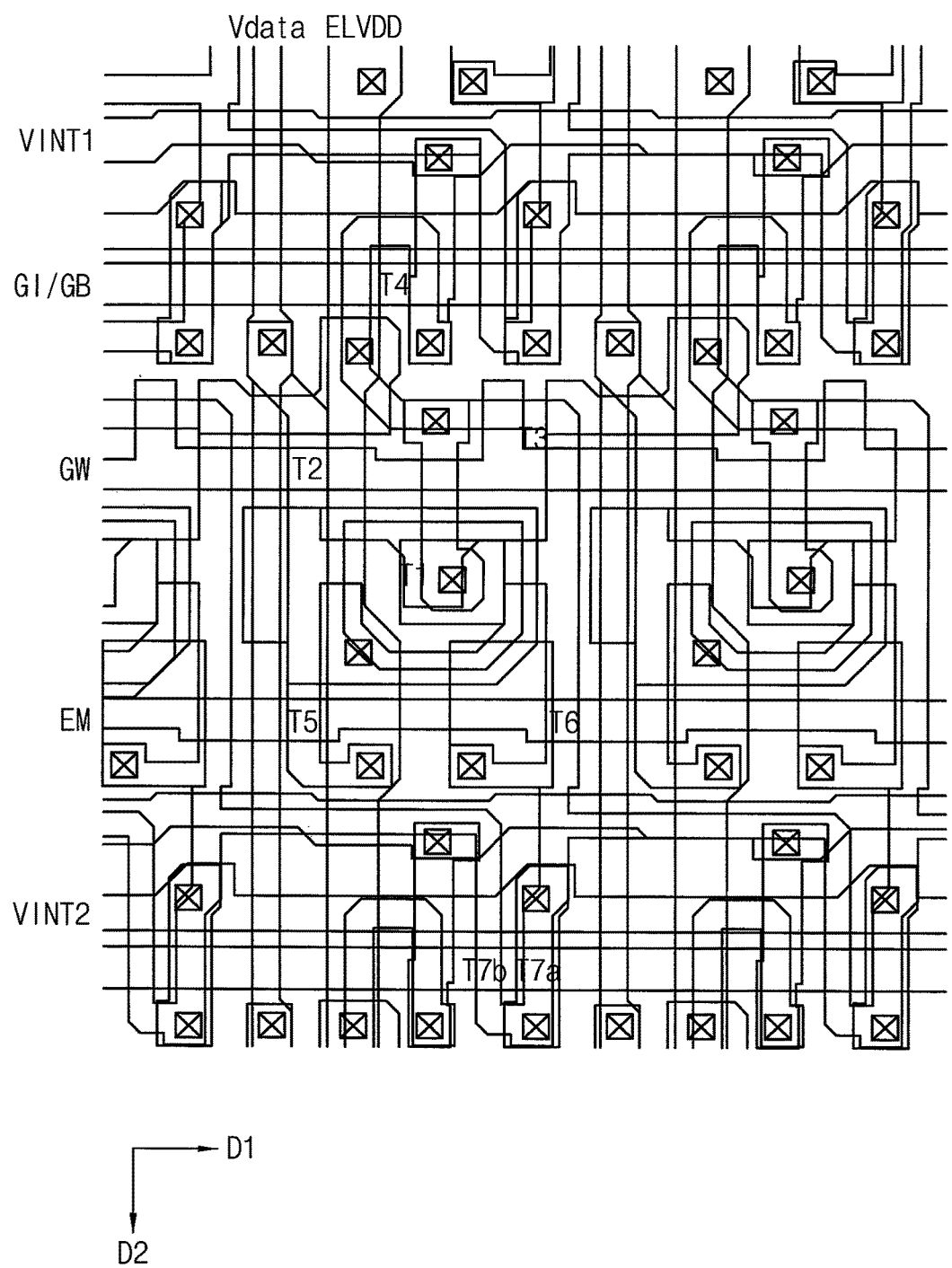
FIG. 3 is a plan view illustrating a layout of the pixels of the organic light emitting display apparatus of FIGS. 1 and 2.
Figure 4A:
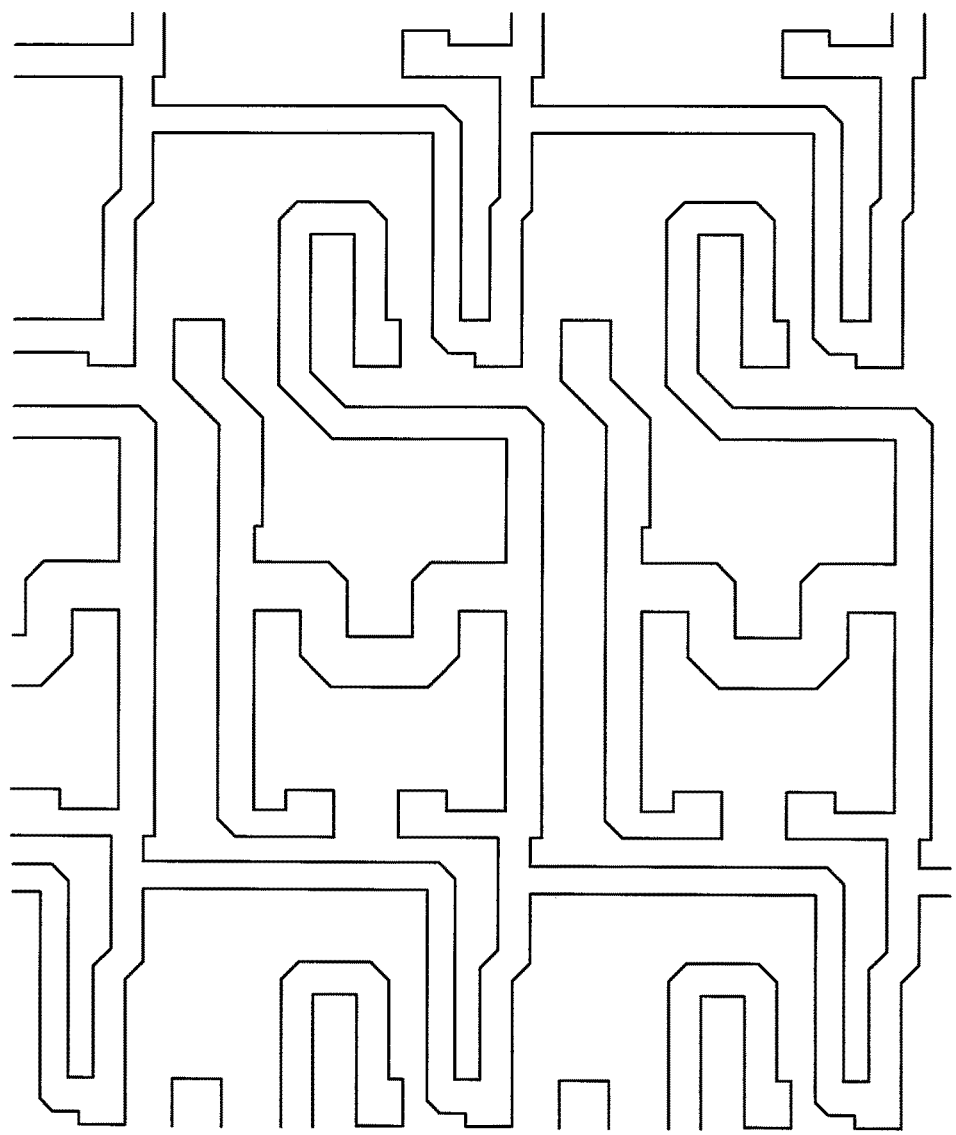
FIG. 4A to 4D are plan views each showing an active layer, a first gate layer, a second gate layer, and a data layer of the organic light emitting display apparatus of FIG. 1.
Figure 4B:
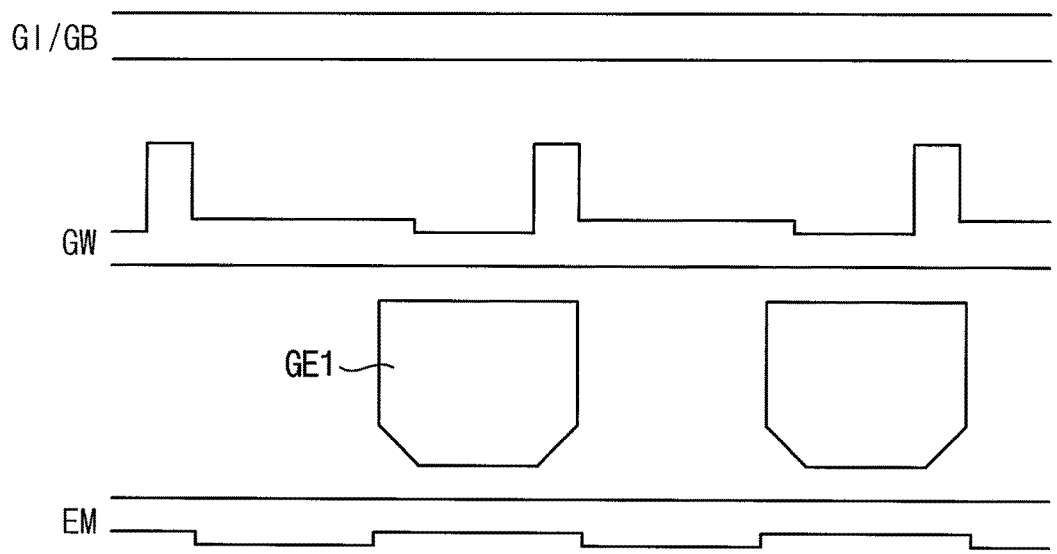
Figure 4B:
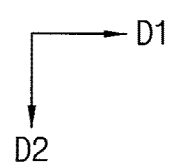
Figure 4C:
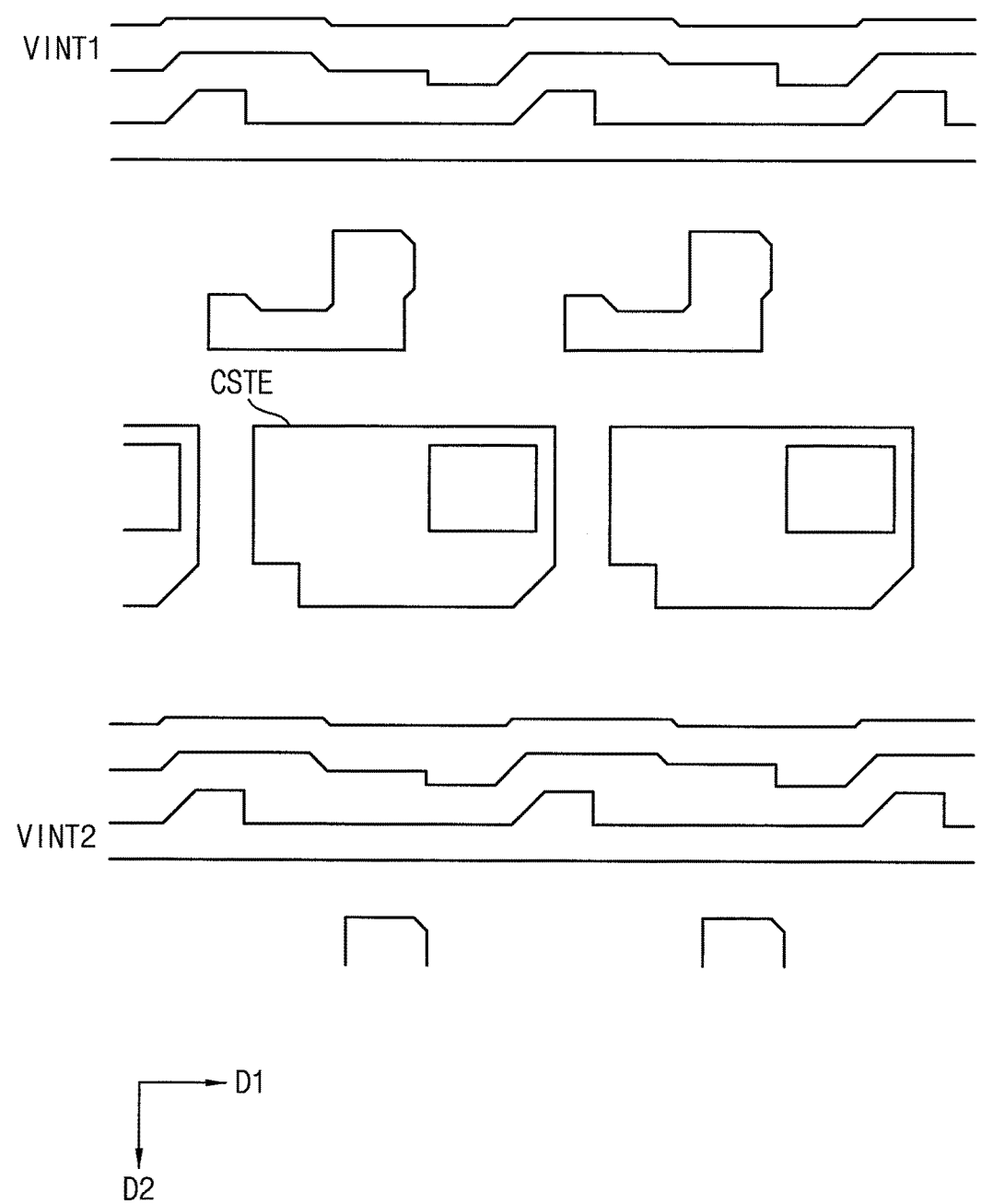
Figure 4D:
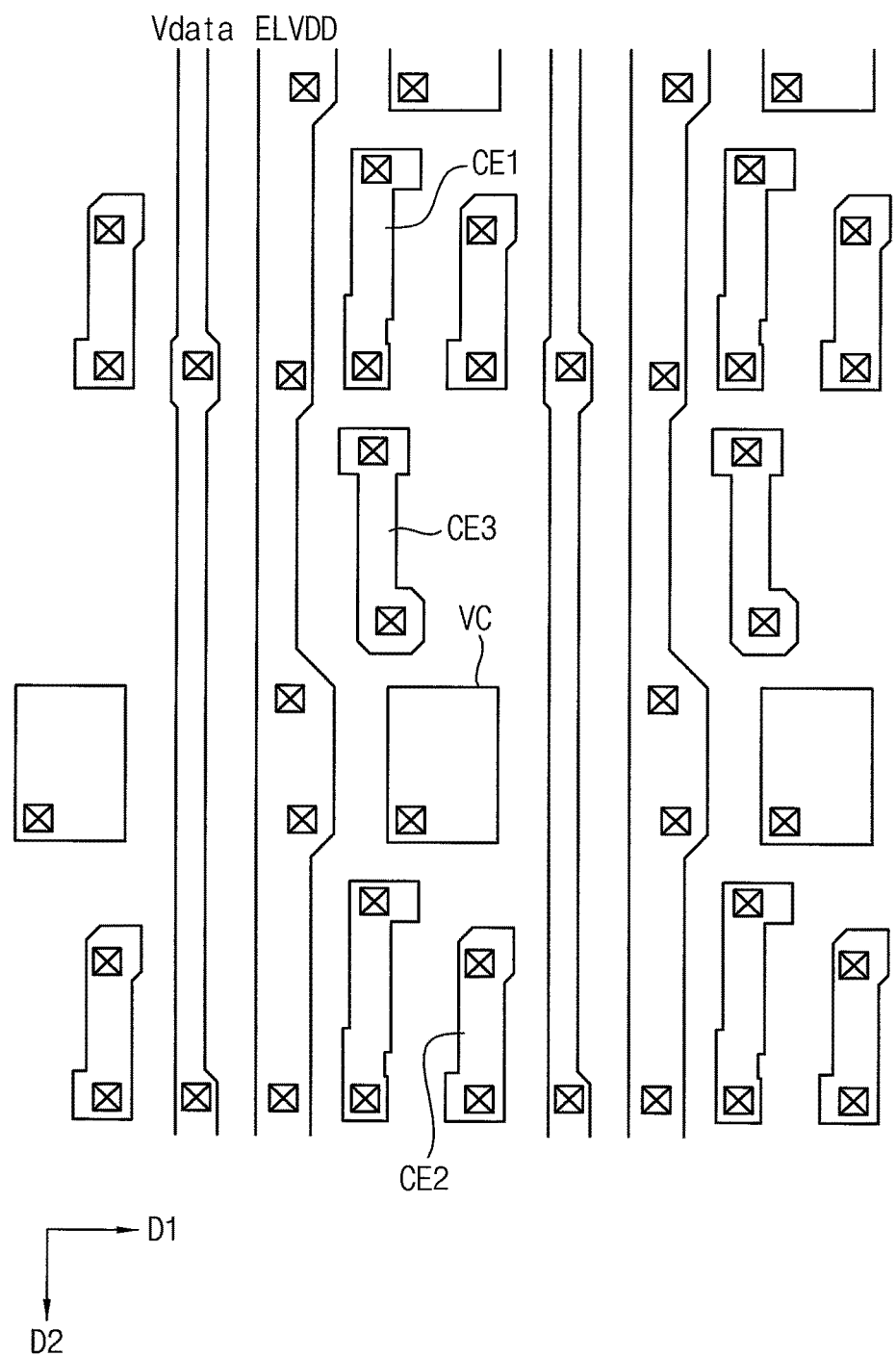
Figure 5:
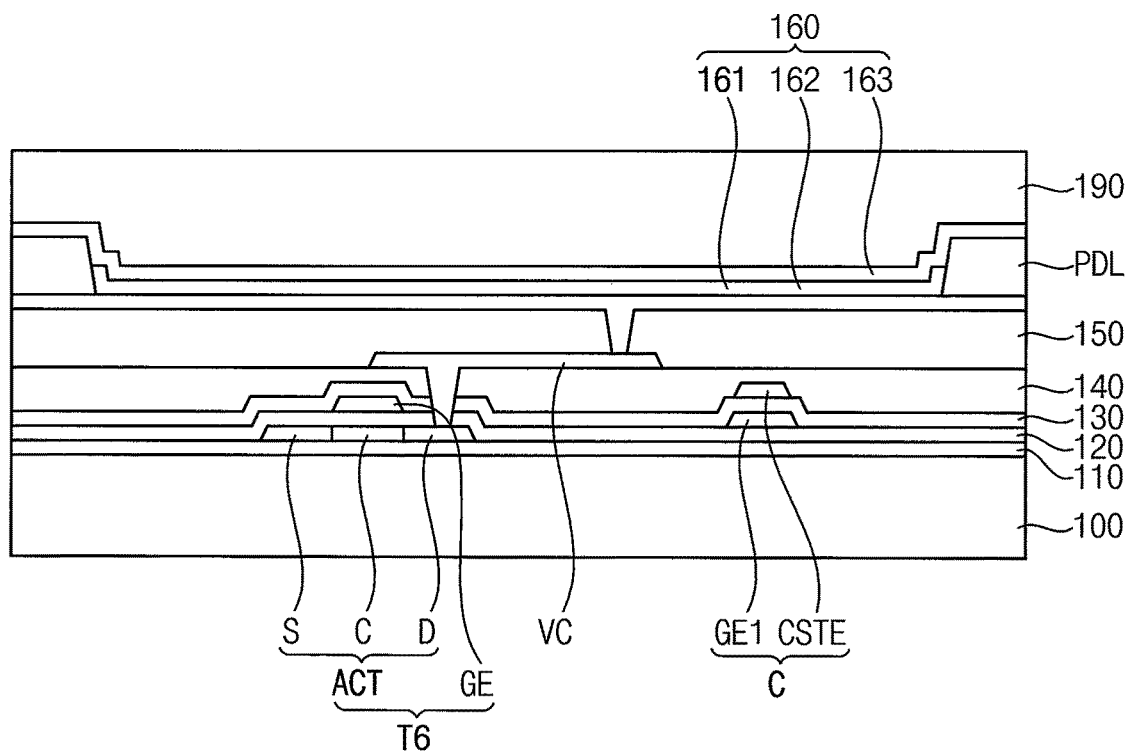
FIG. 5 is a cross-sectional view of the organic light emitting display apparatus of FIG. 3.

FIG. 3 is a plan view illustrating a layout of the pixels of the organic light emitting display apparatus of FIGS. 1 and 2. FIG. 4A to 4D are plan views each showing an active layer, a first gate layer, a second gate layer, and a data layer of the organic light emitting display apparatus of FIG. 1. FIG. 5 is a cross-sectional view of the organic light emitting display apparatus of FIG. 3.

Referring to FIGS. 3, 4A, 4B, 4C, 4D and 5, the organic light emitting display apparatus may include a substrate 100, a buffer layer 110, an active layer, a first gate insulation layer 120, a first gate layer, a second gate insulation layer 130, a second gate layer, a interlayer insulation layer 140, a data layer, a via layer 150, a light emitting structure 160, a pixel defining layer PDL, and a thin film encapsulation layer 190.

The substrate 100 including transparent or opaque insulation materials may be provided. In an exemplary embodiment, the substrate 100 may include a quartz substrate, a synthetic quartz substrate, a calcium fluoride substrate, a fluoride-doped quartz substrate, a soda lime glass substrate, a non-alkali glass substrate etc., for example. In an alternative exemplary embodiment, the substrate 100 may include a flexible transparent material such as a flexible transparent resin substrate (e.g., a polyimide substrate).

The buffer layer 110 may be disposed on the substrate 100. The buffer layer 110 may prevent the diffusion of metal atoms and/or impurities from the substrate 100 into the active layer. In addition, the buffer layer 110 may control a rate of a heat transfer in a crystallization process for forming the active pattern, thereby obtaining substantially uniform the active layer.

The active layer may be disposed on the buffer layer 110. The active layer may include a plurality of active patterns. Each of the active patterns may be arranged corresponding to the plurality of pixels along the first direction D1 and may form one wiring physically connected in the first direction D1. The active patterns may be disconnected from each other in a second direction D2 that intersects the first direction D1.

The active pattern may include amorphous silicon or polycrystalline silicon. In exemplary embodiments, the active pattern may include oxide of at least one substance including indium (In), gallium (Ga), stannum (Sn), zirconium (Zr), vanadium (V), hafnium (Hf), cadmium (Cd), germanium (Ge), chromium (Cr), titanium (Ti), and zinc (Zn), for example. The active pattern ACT may include a source region S and a drain region D doped with an impurity, and a channel region C disposed between the source region S and the drain region D of each of the 1, 2, 3, 4, 5, 6, 7a and 7b transistors T1, T2, T3, T4, T5, T6, T7a and T7b. (refer to FIG. 5).

The first gate insulation layer 120 may be disposed on the buffer layer 110 on which the active layer is disposed. The first gate insulation layer 120 may be uniformly disposed on the buffer layer 110 along a profile of the active layer. In an exemplary embodiment, the first gate insulation layer 120 may include a silicon compound, metal oxide, etc., for example.

The first gate layer may be disposed on the first gate insulation layer 120. The first gate layer may include a first gate electrode GE1 of the first transistor T1 (GE of the sixth transistor T6 in FIG. 5), an initialization line GI/GB, a scan line GW, and a light emission control line EM. In an exemplary embodiment, the first gate layer may be provided using metal, alloy, metal nitride, conductive metal oxide, transparent conductive material, etc., for example.

The initialization line GI/GB may extend in the first direction D1. A first initialization signal GI or a second initialization signal GB may be applied to the initialization line GI/GB.

The scan line GW may extend in the first direction D1. The scan line GW may be disposed between the initialization line GI/GB and the light emission control line EM. A scan signal GW may be applied to the scan line GW.

The light emission control line EM may extend in the first direction D1. The emission control signal EM may be applied to the light emission control line EM.

The second gate insulation layer 130 may be disposed on the first gate insulation layer 120 on which the first gate layer is disposed. The second gate insulation layer 130 may be uniformly disposed on the first gate insulation layer 120 along a profile of the first gate layer. The second gate insulation layer 130 may include a silicon compound, metal oxide, etc., for example.

The second gate layer may be disposed on the second gate insulation layer 130. The second gate layer may include a first initialization power supply line VINT1, a second initialization power supply line VINT2, and a storage electrode CSTE. The second gate layer may be provided using a metal, an alloy, a metal nitride, a conductive metal oxide, a transparent conductive material, or the like.

The first initialization power supply line VINT1 may extend in the first direction D1. The first initialization voltage VINT1 may be applied to the first initialization power supply line VINT1.

The second initialization power supply line VINT2 may extend in the first direction D1. A second initialization power voltage VINT2 may be applied to the second initialization power supply line VINT2.

The storage electrode CSTE may be disposed to overlap with the first gate electrode GE1 to form a driving capacitor C with the first gate electrode GE1.

The interlayer insulation layer 140 may be disposed on the second gate insulation layer 130 on which the second gate layer is disposed. In an exemplary embodiment, the second gate insulation layer 130 may have a relatively large thickness for sufficiently covering the active pattern, so that the second gate insulation layer 130 may have a substantially level surface, for example. In an exemplary embodiment, the interlayer insulation layer 140 may be uniformly disposed on the second gate insulation layer 130 along a profile of the second gate layer. The interlayer insulation layer 140 may be provided using an organic or inorganic insulating material. The interlayer insulation layer 140 may include a plurality of layers.

The data layer may be disposed on the interlayer insulation layer 140. The data layer may include ae data line Vdata, a first power supply line ELVDD, a first connecting electrode CE1, a second connecting electrode CE2, a third connecting electrode CE3, and a via contact electrode VC.

The data line Vdata may extend in the second direction D2. A data signal Vdata may be applied to the data line Vdata. The data line Vdata may be electrically connected to the active layer through contact holes defined through the interlayer insulation layer 140, the second gate insulation layer 130, and the first gate insulation layer 120.

The first power supply line ELVDD may extend in the second direction D2. A first power source voltage ELVDD may be applied to the first power source line ELVDD. The first power supply line ELVDD may be electrically connected to the active layer and the second gate electrode via contact holes defined through the interlayer insulation layer 140, the second gate insulation layer 130, and the first gate insulation layer 120.

The first connecting electrode CE1 may be electrically connected to the active layer and the second gate layer through contact holes defined through the interlayer insulation layer 140, the second gate insulation layer 130, and the first gate insulation layer 120. Thus, the first connecting electrode CE1 may be connected to the first initialization power supply line VINT1 and the fourth transistor T4.

The second connecting electrode CE2 may be electrically connected to the active layer and the second gate layer through contact holes defined through the interlayer insulation layer 140, the second gate insulation layer 130, and the first gate insulation layer 120. Thus, the second connecting electrode CE2 may be connected to the second initialization power supply line VINT2 and the seventh-a and seventh-b transistors T7a and T7b.

The third connecting electrode CE3 may be electrically connected to the active layer and the first gate layer through contact holes defined through the interlayer insulation layer 140, the second gate insulation layer 130, and the first gate insulation layer 120. Thus, the third connecting electrode CE3 may be connected to the first transistor T1 and the third transistor T3.

The via contact electrode VC maybe electrically connected to the active layer through contact holes defined through the interlayer insulation layer 140, the second gate insulation layer 130, and the first gate insulation layer 120. That is, the via contact electrode VC may be connected to the sixth transistor T6.

The via layer 150 may be disposed on the interlayer insulation layer 140 on which the data layer is disposed. The via layer 150 may have a single-layered structure or a multi-layered structure including at least two insulation films. The via layer 150 may be provided using an organic material. In an exemplary embodiment, the via layer 150 may include photoresist, acryl-based resin, polyimide-based resin, polyamide-based resin, siloxane-based resin, etc., for example. In an exemplary embodiment, the via layer 150 may be provided using an inorganic material such as a silicon compound, a metal, a metal oxide, or the like.

The light emitting structure 160 may include a first electrode 161, an emission layer 162 and a second electrode 163.

The first electrode 161 may be disposed on the via layer 150. The first electrode 161 may include a reflective material or a transmissive material in accordance with the emission type of the display apparatus. In an exemplary embodiment, the first electrode 161 may be provided using aluminum, alloy including aluminum, aluminum nitride, silver, alloy including silver, tungsten, tungsten nitride, copper, alloy including copper, nickel, alloy including nickel, chrome, chrome nitride, molybdenum, alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc., for example. These may be used alone or in a combination thereof. In exemplary embodiments, the first electrode 161 may have a single layer structure or a multi layer structure, which may include a metal film, an alloy film, a metal nitride film, a conductive metal oxide film and/or a transparent conductive film.

The pixel defining layer PDL may be disposed on the via layer 150 on which the first electrode 161 is disposed. The pixel defining layer PDL may be provided using an organic material. In an exemplary embodiment, the pixel defining layer PDL may include photoresist, acryl-based resin, polyimide-based resin, polyamide-based resin, siloxane-based resin, etc., for example. In exemplary embodiments, an opening which exposes the first electrode 161 may be defined by etching the pixel defining layer PDL. An emitting area and a non-emitting area of the display apparatus may be defined by the opening of the pixel defining layer PDL. In an exemplary embodiment, a portion where the opening of the pixel defining layer PDL is located may correspond to the emitting area, and the non-emitting area may correspond to a portion adjacent to the opening of the pixel defining layer PDL, for example.

The light emitting layer 162 may be disposed on the first electrode 161 exposed through the opening of the pixel defining layer PDL. In addition, the light emitting layer 162 may extend on a sidewall of the opening of the pixel defining layer PDL. In exemplary embodiments, the light emitting layer 182 may include an organic light emitting layer ("EL"), a hole injection layer ("HIL"), a hole transfer layer ("HTL"), an electron transfer layer ("ETL"), an electron injection layer ("EIL"), etc. In exemplary embodiments, except for the organic emission layer, the HIL, the hole transport layer, the electron transport layer, and the electron injection layer may be provided in common to correspond to a plurality of pixels. In exemplary embodiments, a plurality of ELs may be provided using light emitting materials for generating different colors of light such as a red color of light, a green color of light and a blue color of light in accordance with color pixels of the display device. In exemplary embodiments, the EL of the light emitting layer 162 may include a plurality of stacked light emitting materials for generating a red color of light, a green color of light and a blue color of light to thereby emitting a white color of light. Here, elements of the light emitting layer 162 are commonly provided so as to correspond to a plurality of pixels, and each pixel may be divided by a color filter layer.

The second electrode 163 may be disposed on the pixel defining layer PDL and the light emitting layer 162. The second electrode 163 may include a transmissive material or a reflective material in accordance with the emission type of the display device. In an exemplary embodiment, the second electrode 163 may be provided using aluminum, alloy including aluminum, aluminum nitride, silver, alloy including silver, tungsten, tungsten nitride, copper, alloy including copper, nickel, alloy including nickel, chrome, chrome nitride, molybdenum, alloy including molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc., for example. These may be used alone or in a combination thereof. In exemplary embodiments, the second electrode 163 may also have a single layer structure or a multi layer structure, which may include a metal film, an alloy film, a metal nitride film, a conductive metal oxide film and/or a transparent conductive film.

The thin film encapsulation layer 190 may be disposed on the second electrode 163. The thin film encapsulation layer 190 may prevent penetration of moisture and oxygen from outside. The thin film encapsulation layer 190 may include a first inorganic layer, an organic layer and a second inorganic layer. The first inorganic layer, the organic layer, and the second inorganic layer may be sequentially stacked on the second electrode 163.

Here, the thin film encapsulation layer 190 may include at least one organic layer and at least one inorganic layer. The at least one organic layer and the at least one inorganic layer may be alternately stacked with each other. In the illustrated exemplary embodiment, the thin film encapsulation layer 190 includes the first and second inorganic layers and one organic layer therebetween, but the invention is not limited thereto.

Here, the plurality of pixels may be arranged in a matrix in a first direction D1 and a second direction D2 intersecting the first direction D1. The seventh-a transistor T7a and the second OLED initialization transistor which is the seventh-b transistor T7b may be disposed adjacent to each other in the first direction D1. In addition, the seventh-a transistor T7a and the seventh-b transistor T7b may be disposed adjacent to each other in the first direction D1 with respect to the fourth transistor of the adjacent pixel in the second direction D2.

According to the illustrated exemplary embodiment, since the active patterns of the active layer are connected corresponding to the plurality of pixels, static electricity is dispersed even when the static electricity flows in during a manufacturing process, use, or the like, and degree of the characteristic change of the active pattern or the damage of the active pattern is reduced, so that scattering of the first to seventh-b transistors may be reduced. Accordingly, the display quality of the organic light emitting display apparatus may be improved.

Figure 6:
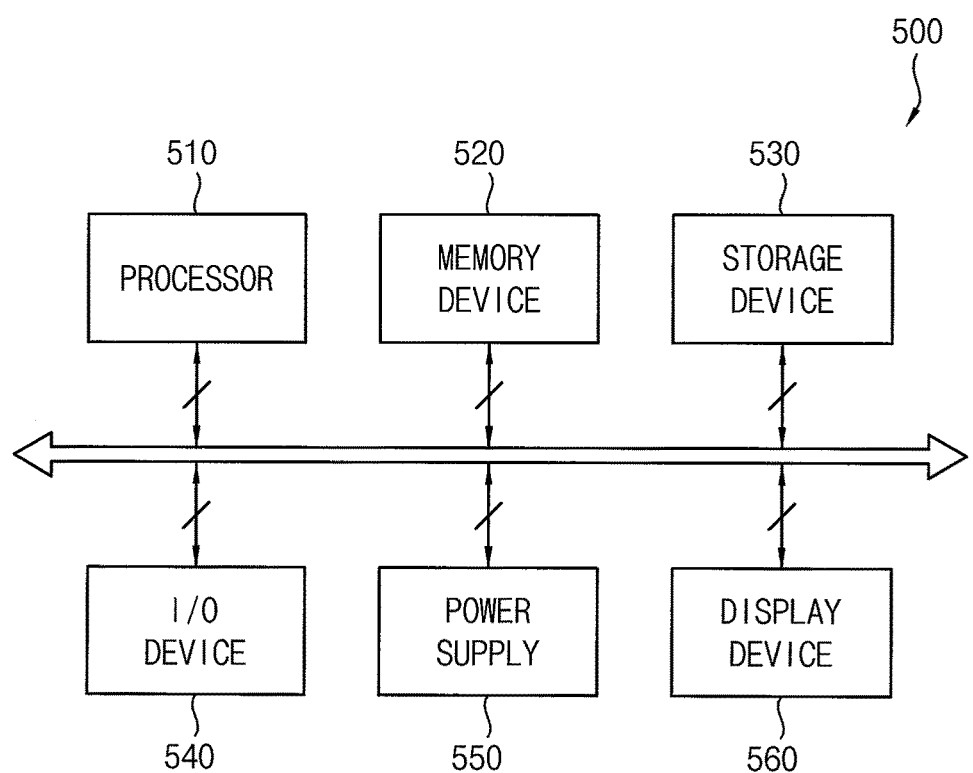
FIG. 6 is a block diagram illustrating an exemplary embodiment of an electronic device.
Figure 7A:
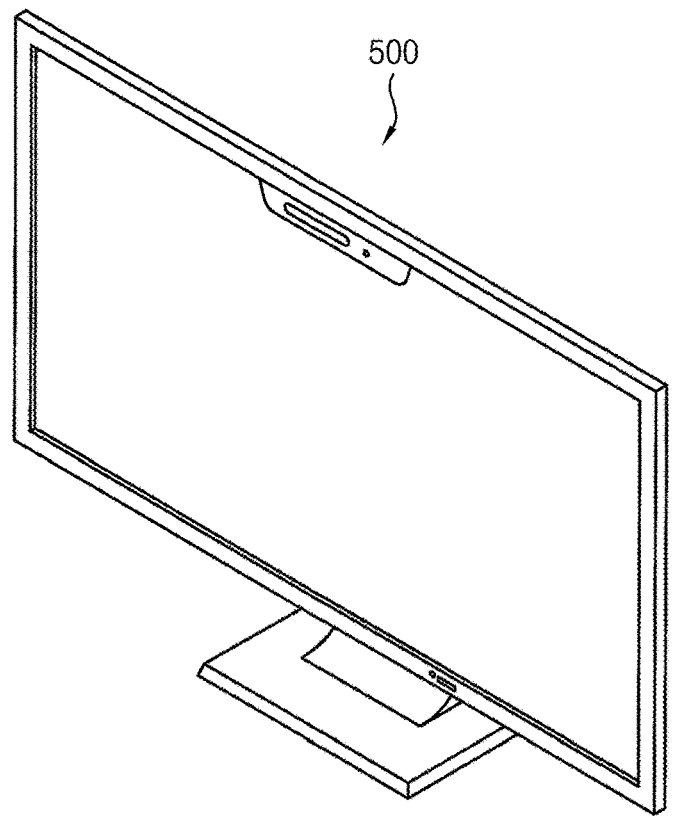
FIG. 7A is a diagram illustrating an example in which the electronic device of FIG. 6 is implemented as a television.
Figure 7B:
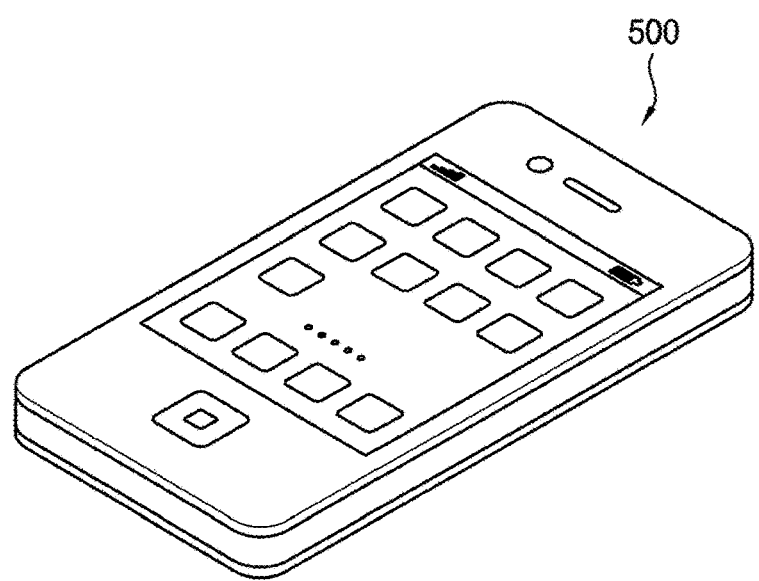
FIG. 7B is a diagram illustrating an example in which the electronic device of FIG. 6 is implemented as a smart phone.

FIG. 6 is a block diagram illustrating an electronic device according to exemplary embodiments. FIG. 7A is a diagram illustrating an example in which the electronic device of FIG. 6 is implemented as a television. FIG. 7B is a diagram illustrating an example in which the electronic device of FIG. 6 is implemented as a smart phone.

Referring to FIGS. 6 through 7B, the electronic device 500 may include a processor 510, a memory device 520, a storage device 530, an input/output ("I/O") device 540, a power supply 550, and an organic light emitting display apparatus 560. Here, the organic light emitting display apparatus 560 may correspond to the display apparatus 1000 of FIG. 1. In addition, the electronic device 500 may further include a plurality of ports for communicating with a video card, a sound card, a memory card, a universal serial bus ("USB") device, other electronic devices, etc. In an exemplary embodiment, as illustrated in FIG. 7A, the electronic device 500 may be implemented as a television. In another exemplary embodiment, as illustrated in FIG. 7B, the electronic device 500 may be implemented as a smart phone. However, the electronic device 500 is not limited thereto. In an exemplary embodiment, the electronic device 500 may be implemented as a cellular phone, a video phone, a smart pad, a smart watch, a tablet personal computer ("PC"), a car navigation system, a computer monitor, a laptop, a head disposed (e.g., mounted) display ("HMD"), etc., for example.

The processor 510 may perform various computing functions. In an exemplary embodiment, the processor 510 may be a microprocessor, a central processing unit ("CPU"), an application processor ("AP"), etc., for example. In an exemplary embodiment, the processor 510 may be coupled to other components via an address bus, a control bus, a data bus, etc., for example. Further, the processor 510 may be coupled to an extended bus such as a peripheral component interconnection ("PCI") bus. The memory device 520 may store data for operations of the electronic device 500. In an exemplary embodiment, the memory device 520 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, etc., and/or at least one volatile memory device such as a dynamic random access memory ("DRAM") device, a static random access memory ("SRAM") device, a mobile DRAM device, etc., for example. In an exemplary embodiment, the storage device 530 may include a solid state drive ("SSD") device, a hard disk drive ("HDD") device, a CD-ROM device, etc., for example. In an exemplary embodiment, the I/O device 540 may include an input device such as a keyboard, a keypad, a mouse device, a touchpad, a touch-screen, etc., and an output device such as a printer, a speaker, etc. The power supply 550 may provide power for operations of the electronic device 500.

The organic light emitting display apparatus 560 may be coupled to other components via the buses or other communication links. In exemplary embodiments, the organic light emitting display apparatus 560 may be included in the I/O device 540. As described above, the organic light emitting display apparatus 560 may include active patterns arranged corresponding to a plurality of pixels, and connected to each other along a first direction, a first initialization power supply line to which a first initialization voltage is applied, a second initialization power supply line to which a second initialization voltage different from the first initialization voltage is applied, an OLED, and an OLED initialization transistor which apply the second initialization voltage to an anode electrode of the OLED.

The invention may be applied to organic light emitting display apparatus and various electronic devices including the same. In an exemplary embodiment, the invention may be applied to a mobile phone, a smart phone, a video phone, a smart pad, a smart watch, a tablet PC, a car navigation system, a television, a computer monitor, a notebook, a head mount display and the like, for example.

The foregoing is illustrative of the invention and is not to be construed as limiting thereof. Although exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An organic light emitting display apparatus, comprising:
    active patterns arranged corresponding to a plurality of pixels, and connected to each other along a first direction;
    a first initialization power supply line to which a first initialization voltage is applied;
    a second initialization power supply line to which a second initialization voltage different from the first initialization voltage is applied;
    an organic light emitting diode; and
    a first transistor which apply the second initialization voltage to a first electrode of the organic light emitting diode,
    wherein the first transistor comprises a first_first transistor and a first second transistor,
    a first electrode of the first_first transistor is electrically connected to a first electrode of the first second transistor, and
    a second electrode of the first_first transistor is electrically connected to a second electrode of the first second transistor.

2. The organic light emitting display apparatus of claim 1, wherein
    a second initialization signal is applied to a gate electrode of the first_first transistor and a gate electrode of the first_second transistor.

3. The organic light emitting display apparatus of claim 2, wherein the first_first transistor and the first second transistor are disposed adjacent to each other.

4. The organic light emitting display apparatus of claim 3, wherein the active patterns are physically connected to each other in a pixel of the plurality of pixels, and
    the active patterns include a channel region of the first_first transistor and a channel region of the first_second organic transistor.

5. The organic light emitting display apparatus of claim 2, further comprising:
    an initialization line which extends in the first direction and to which a first initialization signal or a second initialization signal is applied.

6. The organic light emitting display apparatus of claim 5, wherein the first_first transistor and the first_second transistor overlap the initialization line.

7. The organic light emitting display apparatus of claim 1, further comprises:
    a second transistor which is electrically connected to a first power source and the first electrode of the organic light emitting diode, and applies a driving current corresponding to a data signal to the organic light emitting diode;
    a capacitor electrically connected between a gate electrode of the second transistor and the first power source; and
    a third transistor which applies the first initialization voltage to the gate electrode of the second transistor and the capacitor in response to a first initialization signal.

8. The organic light emitting display apparatus of claim 7, further comprising:
    a data line extending in a second direction intersecting with the first direction and to which the data signal is applied;
    a fourth transistor electrically connected to a first electrode of the second transistor and the data line; and
    a fifth transistor electrically connected to the gate electrode of the second transistor and a second electrode of the second transistor.

9. The organic light emitting display apparatus of claim 1, wherein the plurality of pixels is arranged in a matrix form in the first direction and a second direction intersecting the first direction,
    the active patterns of the plurality of pixels in the first direction are connected to each other, and the active patterns of the plurality of pixels in the second direction include portions which are disconnected to each other.

10. The organic light emitting display apparatus of claim 9, wherein the first transistor comprises a first_first transistor and a first_second transistor,
    a source electrode of the first_first transistor is electrically connected to a source electrode of the first_second transistor,
    a drain electrode of the first_first transistor is electrically connected to a drain electrode of the first_second transistor,
    a second initialization signal is applied to a gate electrode of the first_first transistor and a gate electrode of the first_second transistor, and
    the first_first transistor and the first_second transistor are arranged adjacent to each other in the first direction.

11. An organic light emitting display apparatus, comprising:
    a substrate;

an active layer comprising active patterns disposed on the substrate, and connected to each other corresponding to at least two pixels;

a first gate insulation layer disposed on the substrate on which the active layer is disposed;

a first gate layer disposed on the first gate insulation layer;

a second gate insulation layer disposed on the first gate insulation layer on which the first gate layer is disposed;

a second gate layer disposed on the second gate insulation layer;

an interlayer insulation layer disposed on the second gate insulation layer on which the second gate layer is disposed; and a data layer disposed directly on the interlayer insulation layer.

12. The organic light emitting display apparatus of claim 11, wherein the first gate layer comprises an initialization line to which a first initialization signal or a second initialization signal is applied, a scan line to which a scan signal is applied, and an emission control line to which an emission control signal is applied.

13. The organic light emitting display apparatus of claim 12, wherein the second gate layer comprises a first initialization power supply line to which a first initialization voltage is applied and a second initialization power supply line to which a second initialization power voltage is applied.

14. The organic light emitting display apparatus of claim 13, wherein the data layer comprises a data line to which a data signal is applied, and a first power supply line to which a first power voltage is applied.

15. The organic light emitting display apparatus of claim 14, further comprising:

first_first and first_second transistors, which apply the second initialization voltage to a first electrode of the organic light emitting diode in response to the second initialization signal.

16. The organic light emitting display apparatus of claim 15, further comprising:

a second transistor which is electrically connected to a first power source and the first electrode of the organic light emitting diode, and applies a driving current corresponding to a data signal to the organic light emitting diode;

a capacitor electrically connected between a gate electrode of the second transistor and the first power source; and a third transistor which applies the first initialization voltage to the gate electrode of the second transistor and the capacitor in response to a first initialization signal.

17. The organic light emitting display apparatus of claim 16, wherein the data layer further comprises a connecting electrode, and the connection electrode is connected to the second initialization power supply line and the first_first and first_second transistors.

18. The organic light emitting display apparatus of claim 15, wherein the first_first transistor and the first_second transistor overlap the initialization line.

19. The organic light emitting display apparatus of claim 11, wherein a plurality of pixels is arranged in a matrix form in a first direction and a second direction intersecting the first direction, the active patterns of the plurality of pixels in the first direction are connected to each other, and the active patterns of the plurality of pixels in the second direction include portions which are disconnected to each other.

20. An organic light emitting display apparatus, comprising:

an organic light emitting diode; and first_first and first_second transistors which apply an organic light emitting diode initialization voltage to a first electrode of the organic light emitting diode in response to an organic light emitting diode initialization signal, and wherein first and second electrodes of the first_first transistor are electrically connected to first and second electrodes of the first_second transistor, respectively, and a gate electrode of the first_first transistor is electrically connected to a gate electrode of the first_second transistor.

* * * * *